United States Patent [19]

Frank

[11] Patent Number: 4,905,307
[45] Date of Patent: Feb. 27, 1990

[54] SYNCHRONOUS RECEIVER WITH DIRECT MIXING

[75] Inventor: Georg Frank, Heilbronn, Fed. Rep. of Germany

[73] Assignee: Telefunken electronic GmbH, Heilbronn, Fed. Rep. of Germany

[21] Appl. No.: 134,868

[22] Filed: Dec. 18, 1987

[30] Foreign Application Priority Data

Dec. 24, 1986 [DE] Fed. Rep. of Germany ....... 3644392

[51] Int. Cl.$^4$ .............................................. H04B 1/16
[52] U.S. Cl. .................................... 455/209; 455/264; 455/304
[58] Field of Search ............... 455/324, 145, 146, 147, 455/148, 303, 304, 305, 334, 347, 308, 182, 192, 154, 208, 156, 209, 234, 241, 260, 264, 316; 375/97, 98, 81, 102, 120

[56] References Cited

U.S. PATENT DOCUMENTS 4,086,593 4/1978 Chelikowsky et al. ............. 455/339

Primary Examiner—Robert L. Griffin
Assistant Examiner—Curtis Kuntz
Attorney, Agent, or Firm—Spencer & Frank

[57] ABSTRACT

A synchyronous receiver with direct mixing comprising a phase detector and an amplitude demodulator is provided with a square-law envelope detector and means for making the envelope signal audible or visible for tuning purposes.

28 Claims, 4 Drawing Sheets

SYNCHRONOUS RECEIVER WITH DIRECT MIXING

BACKGROUND OF THE INVENTION

Synchronous receivers with direct conversion are receivers in which the received signal (antenna signal or amplified antenna signal) is demodulated by synchronous conversion into baseband. This conversion is carried out on two channels using two orthogonal oscillator signals (with a 90 degree phase difference). The oscillator signals are taken from a voltage-controlled oscillator with outputs for two signals with a 90 degree phase difference (two-phase oscillator). This voltage-controlled oscillator (VCO) is part of a phase-locked loop (PLL) by means of which the oscillator is made to follow the phase position and thus also the frequency of the received signal. During the phase lock condition, i.e., synchronous operation of the phase-locked loop, the amplitude-demodulated signal occurs as a result of the synchronous mixing at the output of the first mixer in the in-phase channel which is fed the oscillator signal (0 degrees) with no difference in phase from the input signal. Hence, this mixer operates as a synchronous amplitude demodulator. The phase-demodulated signal arises at the output of the second mixer in the quadrature channel which is fed the oscillator signal with a 90 degree phase difference from (in quadrature with) the received signal. This mixer is operated as a phase detector which supplies through a regulating filter the control signal for resetting the voltage-controlled oscillator. Envelope detection is carried out by addition of the squared output signals of the in-phase channel and the quadrature channel. The resulting positive, quadratic envelope signal is proportional to the power of the received signal at the mixer inputs and is required as a control signal for the automatic gain control (AGC) of the synchronous receiver. The envelope signal contains the (amplitude) modulation of the received signal.

Synchronous receivers with direct mixing have the disadvantage that undesired whistling and clicking noise occurs during receiver tuning. There is also the danger of missing the desired transmitter if the tuning is carried out too quickly. In contrast to receivers with demodulation by means of amplitude detection (superheterodyne receivers), the output signal of the synchronous demodulator does not necessarily become clearer as the tuning becomes more and more precise, but is only available at the instant of synchronization of the phase-locked loop. Prior to that, only an undesired whistling is received.

SUMMARY OF THE INVENTION

The object underlying the invention is to provide a synchronous receiver with direct conversion for amplitude-modulated signals wherein undesired whistling or clicking noises during tuning and, as far as possible, missing of the desired signal are eliminated. According to the invention, means are provided in a synchronous receiver with direct conversion to make the envelope signal audible or visible for tuning purposes. The invention also offers the advantage that precise fine tuning is aided by the signal strength of the output signal of the receiver being controlled depending on the tuning precision. With the inventive synchronous receiver with direct conversion, it is not the signal of the in-phase channel (synchronous amplitude demodulator) which is used for tuning, as has been standard practice until now, but the envelope signal. When transmitter tuning has been achieved by means of the envelope signal, i.e., in general, the maximum amplitude of the envelope signal has been made audible or visible, a switch-over then takes place and instead of the envelope signal, the synchronous-demodulated in-phase signal (useful signal) which serves for normal reception and on account of the synchronous demodulation exhibits better audio or video quality than the envelope signal is fed to the reproduction or display device (loudspeaker or screen).

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
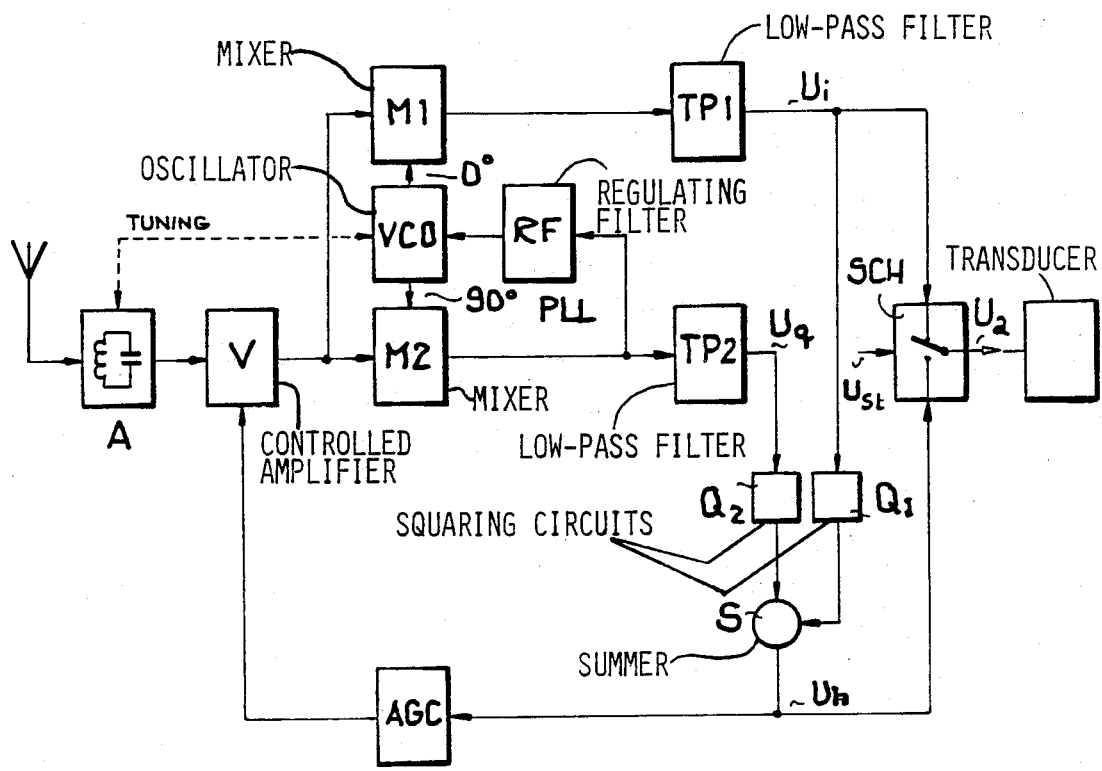
FIG. 1 shows a synchronous receiver with direct conversion.

FIG. 1 shows a synchronous receiver with direct conversion. The synchronous receiver comprises at its input a controlled amplifier V which is fed the antenna signal from the antenna. The amplifier V is controlled by the envelope signal through an AGC filter.

The main component of the synchronous receiver is a phase-locked loop (PLL) which comprises a mixer M2 operating as the phase detector of the PLL, a regulating filter RF and a voltage-controlled two-phase oscillator (VCO). The mixer M2 is fed the amplified antenna signal. Receiver tuning is carried out by variation of the quiescent frequency of the oscillator in the PLL. Exact tuning is achieved (locked-in condition) when the two-phase oscillator controlled by the PLL generates a signal which corresponds exactly with respect to its frequency to the carrier frequency of the antenna signal. The PLL is, however, capable of carrying out the fine tuning within certain limits (capture range). This means that when the voltage-controlled oscillator VCO is approximately adjusted to the carrier frequency of the antenna signal, the PLL automatically assumes the further control of the voltage-controlled oscillator VCO, more particularly, such that the signal supplied by the PLL follows exactly the frequency and phase position of the carrier signal of the antenna signal.

The voltage-controlled two-phase oscillator VCO is driven by the phase-locked loop (PLL) in the locked-in, i.e., synchronous operating mode in such a way that the first of its two orthogonal output signals (0 degrees) is readjusted in phase to the antenna signal and thus also coincides exactly in the frequency. The mixer M2 operating as a phase detector is fed the second output signal of the two-phase oscillator VCO which is different in phase from the first signal by 90 degrees. Mixing of this second signal with the (amplified) antenna signal results, in a known manner, in a signal at the output of this mixer M2 which is directly related to the phase difference between the signal and the oscillator signal. This output signal of mixer M2 is fed to the control filter RF which, in turn, drives the voltage-controlled oscillator VCO and thus brings about phase-locked resetting of the oscillator.

In the in-phase channel of the synchronous receiver, the output signal (0 degrees) of the voltage-controlled oscillator which is not different in phase from the received signal is fed to mixer M1 and converts the antenna signal into base-band. If there is phase coincidence between oscillator signal and antenna signal in the synchronous operating mode, synchronous amplitude demodulation of the antenna signal is effected by this arrangement. Mixer M1 then acts as an amplitude demodulator. The signal-to-noise ratio is 3 dB better in the case of synchronous demodulation than in the case of envelope demodulation.

Mixer M1 is followed by a low-pass filter TP1 and mixer M2 by a low-pass filter TP2. The purpose of the low-pass filters TP1 and TP2 is to filter out undesired signals which are not to be made audible or visible by the device for making the signal audible or visible; i.e., transducer TR. They coincide in their filter characteristic and assume the task of selection. In the event of incomplete tuning, when the phase-locked loop is not yet synchronized and the carrier frequency of the antenna signal and the frequency of the two orthogonal oscillator signals, therefore, still differ from each other, the output signals of the two mixers M1 and M2 are intermediate-frequency signals which, however, may already lie in the frequency range of the demodulated useful signal. They thus cause the disturbing whistling sounds during tuning. As the tuning improves, the intermediate frequency or the carrier frequency of the output signals of the mixers moves towards zero. In the event of precise tuning, when the synchronous state has been reached, the synchronous-demodulated amplitude signal comprised of the useful signal (audio frequency or video frequency) and a d.c. component originating from the carrier signal is obtained at the output of mixer M1. Therefore, the useful signal is only available after tuning has been successfully carried out. It is weaker in its amplitude than the disturbing whistling noise during tuning by the degree of the amplitude modulation.

The synchronous receiver of FIG. 1 comprises two squaring circuits (Q1,Q2). Squaring circuit Q1 squares the signal supplied by the low-pass filter TP1 and squaring circuit Q2 squares the signal supplied by the low-pass filter TP2. The output signals of the two squaring circuits Q1 and Q2 are fed to a summing circuit S which adds both signals and delivers a quadratic (square law) envelope signal on the basis of this quadratic addition or quadratic envelope detection. By squaring and adding the signals supplied by the low-pass filters, a demodulated useful signal (audio or video) is also made available in the event of non-synchronization (inexact tuning), which would not be the case without squaring and adding. The envelope signal is fed to an AGC filter which together with the amplifier V ensures that the useful signal has a certain amplitude. If necessary, the quadratic envelope signal can be equalized (FIG. 4) by a square-root circuit SQR.

According to the invention, the signal of the in-phase channel (output signal of low-pass filter TP1) and the envelope signal (output signal of summing circuit S or square-root circuit SQR) are, in accordance with FIG. 1, fed to a switch SCH which selectively feeds the demodulated in-phase signal or the envelope signal to the transducer TR, i.e., loudspeaker or a display device (e.g. screen).

Figure 2:
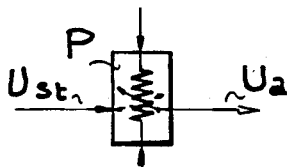
FIG. 2 shows use of a potentiometer instead of a switch.

Instead of a switch SCH, a potentiometer P, in accordance with FIG. 2, can be provided to supply a signal to a loudspeaker or display device (e.g. screen). The component of the demodulated in-phase signal and the component of the envelope signal in this signal are determined by the respective potentiometer setting. Hence the component of the demodulated in-phase signal and the envelope signal in the signal supplied to the loudspeaker or display device can be varied (fade over) by appropriate potentiometer adjustment.

Figure 3:
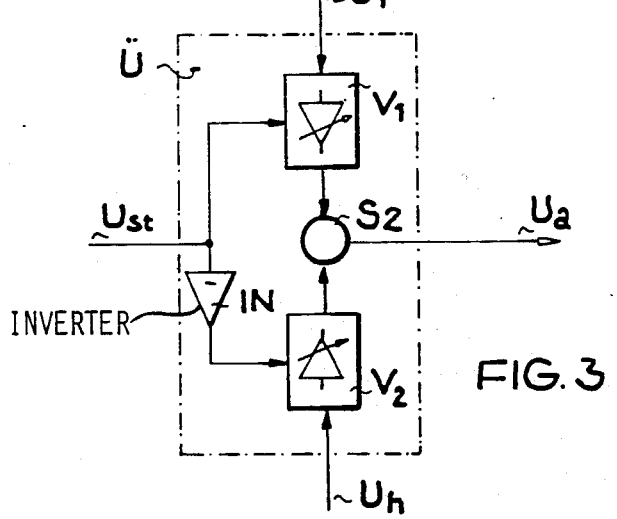
FIG. 3 shows a controllable fade-over device.

In practice, however, an electronically controllable fade-over device Ü will be used instead of a switch or potentiometer. The advantage of such a fade-over device is that it can be integrated into an automatic switchover system. An electronically controllable fade-over device consists, for example, in accordance with FIG. 3, of two amplifiers V1 and V2 and an inverter IN. The amplifier V1 is fed the in-phase signal and also a control signal which controls the amplification of amplifier V1. Amplifier V2 is fed the envelope signal and also a control signal which controls the amplification of amplifier V2. The control signal fed to amplifier V2 is inverted by inverter IN with respect to the control signal fed to amplifier V1. In the event that the amplification of one amplifier increases, the amplification of the other amplifier decreases accordingly as a result of inversion of the two control signals. In this way, the components (mixing ratio) of the in-phase signal and the envelope signal can be altered (in opposite directions). In the extreme case (maximum drive), only one of the two signals is delivered by the fade-over device. This extreme situation is desired during tuning since, in accordance with the invention, only the envelope signal should reach the reproduction or display device during tuning. The fade-over (not immediate switchover from the phase-in signal to the envelope signal) is, in this case, more advantageous than an abrupt switchover (FIG. 1) as an undesired noise would occur during the abrupt switchover.

In accordance with the invention, the envelope signal is supplied to the loudspeaker or display device for tuning purposes instead of the useful signal from the in-phase channel of the synchronous receiver. As mentioned above, in receiver systems with synchronous demodulation, the tuning of a transmitter has until now not been carried out with the envelope signal but with the signal from the in-phase channel of the synchronous receiver. Undesired noise (whistling noise, clicking noise) caused by the circuit gradually reaching synchronization or by the unlocking do, however, occur in tuning with the in-phase signal. "Unlocking" in a PLL is when the PLL is no longer able to follow the antenna signal (carrier frequency) and jumps back to its quiescent frequency. During tuning with the in-phase signal, the desired useful signal is not heard until synchronization has been achieved. On the other hand, during tuning with the in-phase signal, an undesired whistle which depends on the degree of mistuning is heard before synchronization is reached. This whistle does not disappear until the desired synchronization has been achieved. These unwanted noises can be avoided if the tuning in a receiver with synchronous amplitude demodulation is carried out, in accordance with the invention, using the envelope signal (instead of the synchronous-demodulated in-phase signal).

Figure 4:
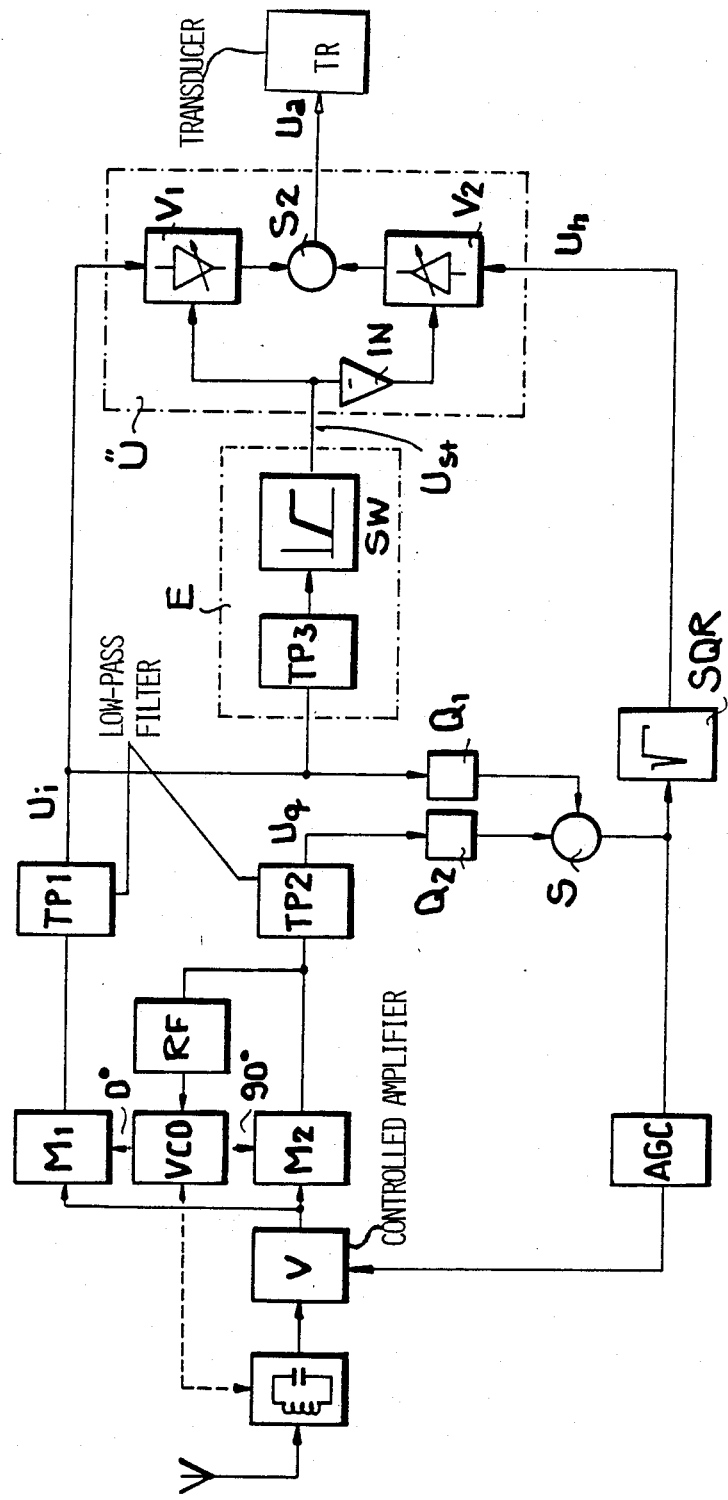
FIG. 4 shows a recognition circuit.

A recognition circuit E which recognizes when the phase-locked loop is in synchronization with the received signal (antenna signal) drives the amplifiers V1 and V2 to adjust the degree of amplification (fade-over circuit Ü). Hence it also recognizes whether a tuning procedure was successful or not. Such a recognition circuit, in the simplest configuration according to FIG. 4, is fed the demodulated signal from the in-phase channel of the synchronous receiver which is band-limited ($U_i$) by the low-pass filter TP1. In the event that the tuning is not yet precise, this signal from the in-phase channel is, as previously stated, a kind of intermediate-frequency signal whose frequency approaches the frequency zero as the tuning improves (less mistuning). In the recognition circuit of FIG. 4, the in-phase signal is supplied to a low-pass filter TP3 which is designed to eliminate the carrier frequency of the signal which is present if the tuning is not precise. Thus no signal occurs at the output of the low-pass filter TP3 if the tuning is inexact. On the other hand, in the event of precise tuning and synchronous reception, the demodulated signal is comprised of a d.c. signal and the useful signal (audio or video signal). The useful signal which is only present in the demodulated in-phase signal if the tuning is precise is filtered out by the low-pass filter TP3. Hence only a d.c. signal is present at the output of the low-pass filter in the event of precise tuning. The two different signal conditions at the output of the low-pass filter TP3 of the recognition circuit E are used during the tuning procedure to first supply the loud-speaker or display device with the envelope signal and when tuning is precise to switch over from the envelope signal to the now synchronous-demodulated in-phase signal. The threshold switch SW of FIG. 4 following the low-pass filter TP3 is to ensure that the switching only occurs at a certain level and that level values which have nothing to do with achieving precise tuning do not initiate switchover.

Figure 5:
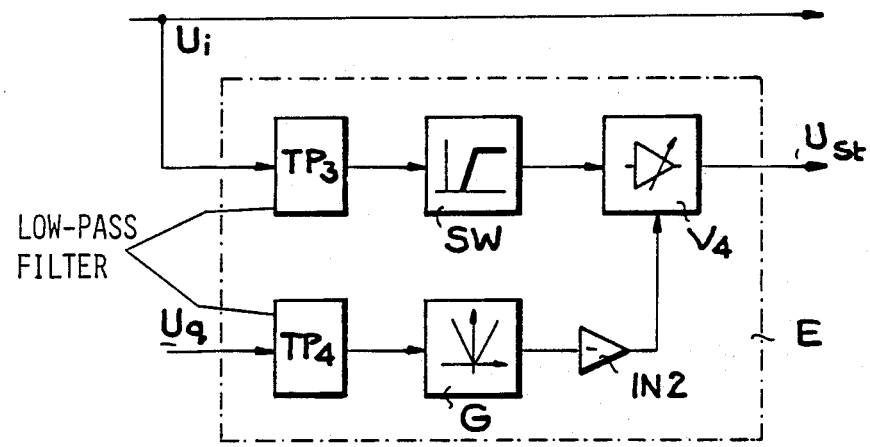
FIG. 5 shows a recognition circuit with a low-pass filter.

Similarly to the circuit of FIG. 4, the recognition circuit of FIG. 5 delivers a signal at the output of the threshold switch SW if tuning is precise and no signal if tuning is inexact. The recognition circuit of FIG. 5 additionally comprises the low-pass filter TP4 which is driven by the output signal of the low-pass filter TP2 (phase signal). The low-pass filter TP4 is designed to deliver no signal at its output during non-synchronous operation of the receiver and to deliver a signal proportional to the phase deviation during synchronous operation. Accordingly, in the case of non-synchronization, the low-pass filter TP4 filters the intermediate-frequency components of the phase signal and in the case of synchronization, the components present in the phase signal which are caused by the useful signal. The level of the signal proportional to the phase deviation increases as the deviation of the tuning signal (tuning knob, synthesizer) fed to the voltage-controlled oscillator VCO from the signal required for precise tuning (mistuning) increases. Or, to phrase it differently, the greater the readjustment the PLL must make, the greater is the deviation of the above-mentioned level from the neutral level, which is normally the signal zero. This value of the component of the tuning to be effected by the PLL can be only be measured indirectly through the phase error of the resulting d.c. signal component at the output of the low-pass filter TP4 and is referred to as mistuning in the PLL.

In the recognition circuit of FIG. 5, this d.c. component at the output of the low-pass filter TP4 is fed to a rectifier G which produces from it a positive signal which now only corresponds to the absolute value of the phase deviation and hence the mistuning. The sign of the phase deviation or the direction of the mistuning is not required for the further functioning of the circuit according to FIG. 5. The recognition circuit of FIG. 5 also comprises an amplifier V4 which amplifies the output signal of the threshold switch SW. This amplification is controlled by the output signal of the inverter IN2 following the rectifier G. On account of the inverter IN2, the amplification of the amplifier V4 is all the less, the more readjustment the PLL must make. This results in timely switchover of the fade-over device to the envelope signal in the event of a high degree of mistuning, whereby the unlocking pulse (a clicking noise caused by the unlocking of the PLL) is suppressed.

Figure 6:
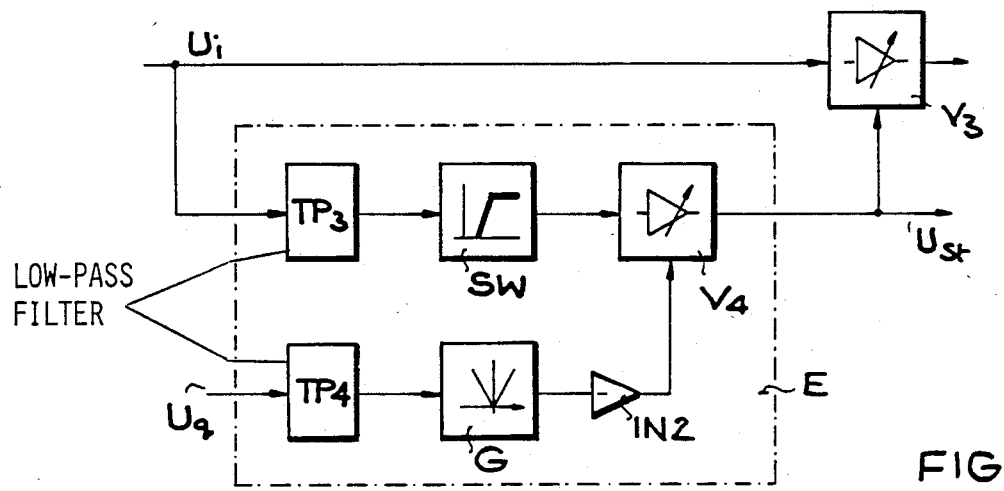
FIG. 6 shows a circuit with a controllable amplifier.

The circuit of FIG. 6 comprises a controllable amplifier V3 which amplifies the output signal of the low-pass filter TP1 (in-phase signal) and transfers it to the fade-over device Ü. This amplification is controlled by the same control signal as is received by the fade-over device. The control is carried out in such a way that in the case of a maximum control signal, the amplification is also maximum. Since this control signal becomes smaller in the event of mistuning, as explained in conjunction with FIG. 5, the volume of the in-phase signal (useful signal) transferred to the fade-over device can, in this way, be controlled in dependence upon the mistuning. Hence maximum volume corresponds to extremely slight mistuning, i.e., optimal tuning and the tuned state can be ascertained acoustically or visually. For good recognizability, the maximum volume should be approximately 10 dB above the volume of the envelope signal.

A further achievement of the above-described circuit of FIG. 6, in comparison with the circuit of FIG. 5, is that at the unlocking instant, i.e., at the moment of fade-over from the synchronous-demodulated in-phase signal to the envelope signal, the in-phase signal is already attenuated to such an extent that the unlocking pulses (clicking noises) occurring in it are reliably faded out.

Figure 7:
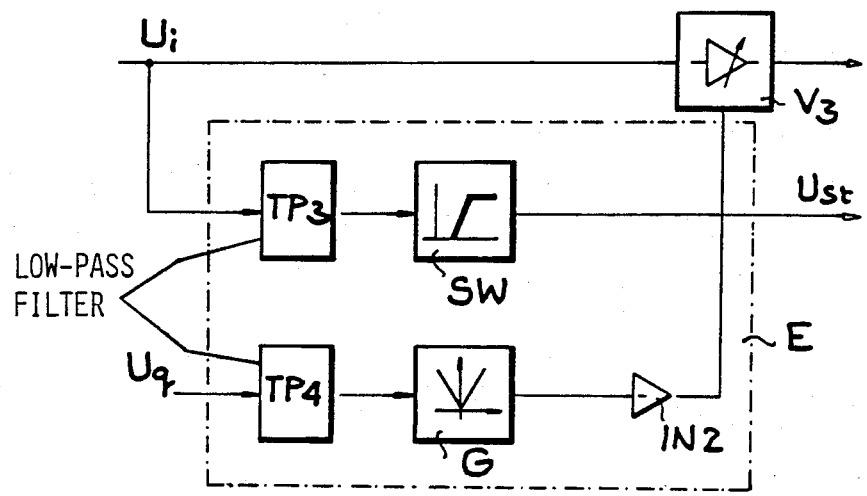
FIG. 7 shows a circuit variant of the circuit of FIG. 6.

FIG. 7 shows a simplified circuit variant of the circuit of FIG. 6. Amplifier V4 does not figure in this circuit. The recognition signal formed from the in-phase signal $U_i$ by the low-pass filter TP3 and the threshold switch SW then again solely controls the fade-over device Ü, as described in conjunction with FIG. 4. The volume of the synchronous-demodulated in-phase signal is again varied (to acoustically check the mistuning) by amplifier V3, described in conjunction with FIG. 6. In this case, however, it is controlled only by the signal which acts on amplifier V4 in FIG. 6 and which is derived from the output signal of the low-pass filter TP2 (phase signal) through the low-pass filter TP4, the rectifier G and the inverter IN2. In comparison with the circuit of FIG. 6, the circuit of FIG. 7 has the disadvantage that switch-over of the fade-over device again occurs abruptly, which may cause a disturbing auditory sensation.

What is claimed is:

1. A direct conversion synchronous receiver which tunes the frequency of an oscillator signal to an input signal, comprising:

a phase-lock loop including a regulating filter, a voltage controlled oscillator controlled by an output of said regulating filter to generate first and second oscillator signals which are respectively 90 degrees out of phase with one another, and a first phase detector in the form of an amplitude demodulator which synchronously demodulates an input signal by mixing the input signal with the second oscillator signal to produce a first mixed signal, said regulating filter filtering the first mixed signal, such that the first oscillator signal is tuned in frequency and phase to that of the input signal;

a second phase detector which demodulates the input signal by mixing the input signal with the first oscillator signal to produce a second mixed signal;

first and second low-pass filter means respectively coupled to said first and second phase detectors, for respectively low-pass filtering the first and second mixed signals, means, coupled to said first and second filter means for quadrating the respective low-pass filtered outputs of said first and second filter means;

means for summing together the quadrated outputs of said quadrating means to obtain a square law envelope signal; and means for making the envelope signal audible or visible during tuning.

2. A synchronous receiver as in claim 1, wherein said means for making the envelope signal audible or visible during tuning comprises means for making the low-pass filtered output of said first filter means audible or visible, including means, responsive to at least one of the low-pass filter outputs, for preventing at least in part, the low-pass filtered output of said second filter means from reaching said means for making the envelope signal audible or visible during the tuning.

3. A synchronous receiver as in claim 1, further comprising one of a switch, a potentiometer and a fade-over device coupling an output of said summing means to said means for making the envelope signal audible or visible during tuning.

4. A synchronous receiver as in claim 3, wherein said one of a switch, a potentiometer and a fade-over device couples the output of said second filter means to said means for making the envelope signal audible or visible during tuning, said receiver further comprising means for controlling said one of a switch, a potentiometer and a fade-over device to adjust relative amounts of the envelope signal and the second mixed signal passed through said one of a switch, a potentiometer and a fade-over device to said means for making the envelope signal audible or visible during the tuning.

5. A synchronous receiver as in claim 3, wherein said one of a switch, a potentiometer and a fade-over device is a switch which alternatively couples the output of said second filter means and the output of the summing means to said means for making the envelope signal audible or visible during tuning.

6. A synchronous receiver as in claim 5, wherein said receiver further comprising means, responsive to at least one of said first and second mixed signals for controlling said switch as a function of the coincidence of the frequency of the input signal and second mixed signal.

7. A direct conversion synchronous receiver having an input port and an output port, which fine tunes the frequency of an oscillator signal to a modulated audio or video input signal received at the input port and provides at the output port a demodulated signal for driving an audio or video transceiver, comprising:

a phase-lock loop including a regulating filter, a voltage controlled oscillator means, controlled by an output of said regulating filter to generate first and second oscillator signals which are respectively 90 degrees out of phase with one another, and a first phase detector in the form of an amplitude demodulator which synchronously demodulates an input signal by mixing the input signal with the second oscillator signal to produce a first mixed signal, said regulating filter filtering the first mixed signal, such that the first oscillator signal is tuned in frequency and phase to that of the input signal;

a second phase detector which demodulates the input signal by mixing the input signal with the first oscillator signal to produce a second mixed signal;

first and second low-pass filter means respectively coupled to said first and second phase detectors, for respectively low-pass filtering the first and second mixed signals, means, coupled to said first and second filter means for quadrating the respective low-pass filtered outputs of said first and second filter means;

means for summing together the quadrated outputs of said quadrating means to obtain a square law envelope signal; and an output port; and means for selectively applying at least a portion of the square law envelope signal to said output port during tuning.

8. A synchronous receiver as in claim 7, wherein said means for selectively applying includes means for applying an output of said second filtering means to said output port when the frequency of the input signal is tuned to the frequency of the first oscillator signal, and for selectively applying a combination of the low-pass filtered output of said second filter means and the square law envelope signal to said output port during tuning.

9. A synchronous receiver as in claim 8, wherein said means for selectively applying includes one of a switch, a potentiometer and a fade-over device which selectively couples the outputs of said second filter means and said summing means to said output port to apply the envelope signal and the second mixed signal thereto, said receiver further comprising means for controlling said one of a switch, a potentiometer and a fade-over device to adjust relative amounts of the envelope signal and the second mixed signal passed through said one of a switch, a potentiometer and a fade-over device to said output port.

10. A synchronous receiver as in claim 9, wherein said one of a switch, a potentiometer and a fade-over device is a fade-over device which includes first and second controlled amplifiers having input terminals for receiving one each of the envelope signal and the second mixed signal, a summing circuit for adding together outputs of said first and second voltage amplifiers, and an invertor, said controlling means comprising means, responsive to at least one of the first and second mixed signals for providing a control signal having a level which is proportional to the coincidence of the respective frequencies of the input signal and second mixed signal, to a control terminal of said first amplifier and to an input of said invertor, said invertor having an output coupled to a control terminal of said second amplifier.

11. A synchronous receiver as in claim 7, wherein said means for selectively applying selectively applies a combination of the low-pass filtered output of said second filter means and the square law envelope signal to said output port during tuning.

12. A synchronous receiver as in claim 7, wherein said means for selectively applying includes one of a switch, a potentiometer and a fade-over device which couples the output of said second filter means to said output port.

13. A synchronous receiver as in claim 12, wherein said one of a switch, a potentiometer and a fade-over device is a fade-over device which includes first and second controlled amplifiers one of which has an input terminal for receiving the envelope signal, a summing circuit for adding together outputs of said first and second controlled amplifiers, and an invertor coupled to the a control terminal of one of the first and second controlled amplifiers.

14. A synchronous receiver as in claim 13, further comprising a recognition circuit having means for recognizing when to supply the envelope signal to and when to withhold the envelope signal from said output port, and providing a corresponding instruction signal to said fade-over device in response to which said fade-over device selectively supplies the envelope signal to or withholds the envelope signal from said output port.

15. A synchronous receiver as in claim 14, wherein said recognition circuit comprises a low-pass filter and a threshold switch connected to an output of this low-pass filter.

16. A synchronous receiver as in claim 14, wherein said recognition circuit comprises a low-pass filter, a threshold switch following the low-pass filter, a further low-pass filter coupled at an input thereof to said first phase detector, a rectifier following the further low-pass filter and an invertor following said rectifier.

17. A synchronous receiver as in claim 16, wherein the threshold switch is followed by an amplifier.

18. A synchronous receiver as in claim 17, wherein said rectifier has an output coupled to a control terminal of said amplifier.

19. A synchronous receiver as in claim 12, wherein said one of a switch, a potentiometer and a fade-over device is a switch which alternatively couples the output of said second filter means and the output of the summing means to said output port.

20. A synchronous receiver as in claim 19, further comprising means, responsive to at least one of the first and second mixed signals for controlling said switch as a function of the coincidence of the respective frequencies of the input signal and second mixed signal.

21. A synchronous receiver as in claim 7, further comprising means for forming during tuning a composite of the low-pass filtered second mixed signal and the square law envelope signal with a selected amplitude ratio of these signals and applying the composite signal to said output port.

22. A synchronous receiver as in claim 21, wherein said applying means comprises means for applying an output of said controllable amplifier to said output port, said recognition circuit comprising means for controlling said applying means with the instruction signal to adjust relative amounts of the envelope signal and the output of said controllable amplifier to said output port.

23. A synchronous receiver as in claim 21, wherein said means for applying a composite includes means for controlling the amplitude ratio in the composite signal of the low-pass filtered second mixed signal and the square law envelope signal as a function of the coincidence of the respective frequencies of the input signal and second mixed signal.

24. A synchronous receiver as in claim 7, further comprising:
a recognition circuit having means for recognizing when to supply the envelope signal to and when to withhold the envelope signal from said output port, and providing a corresponding instruction signal to said means for applying in response to which said means for supplying supplies the envelope signal to or withholds the envelope signal from said output port, said recognition circuit including a one low-pass filter, a threshold switch connected to an output of this low-pass filter, an other low-pass filter coupled at an input thereof to said first phase detector, a rectifier following the other low-pass filter and an invertor following said rectifier; and
a controllable amplifier which amplifies the second mixed signal, an output of said invertor controlling said controllable amplifier.

25. A synchronous receiver as in claim 24, wherein an input to said one low-pass filter is coupled to said second phase detector through said second low-pass filter means.

26. A synchronous receiver as in claim 7, further comprising a square root circuit interposed between said summing means and said output port for equalizing the envelope signal.

27. A synchronous receiver as in claim 7, further comprising:
a recognition circuit having means for recognizing when to supply the envelope signal to and when to withhold the envelope signal from said output port, and providing a corresponding instruction signal to said means for applying in response to which said means for supplying supplies the envelope signal to or withholds the envelope signal from said output port, said recognition circuit including a low pass filter, a threshold switch connected to an output of this low pass filter, a recognition circuit amplifier following said threshold switch, a further low-pass filter coupled at an input thereof to said first phase detector, a rectifier following the further low-pass filter and an invertor following said rectifier; and
a controllable amplifier which amplifies the second mixed signal, an output of said recognition circuit amplifier controlling said controllable amplifier.

28. A synchronous receiver as in claim 27, wherein said recognition circuit amplifier is a further controllable amplifier, an output of said invertor controlling said further controllable amplifier.

* * * * *